US009640634B2

(12) United States Patent
Murthy et al.

(10) Patent No.: US 9,640,634 B2
(45) Date of Patent: May 2, 2017

(54) FIELD EFFECT TRANSISTOR STRUCTURE WITH ABRUPT SOURCE/DRAIN JUNCTIONS

(75) Inventors: Anand S. Murthy, Portland, OR (US);
Robert S. Chau, Beaverton, OR (US);
Patrick Morrow, Portland, OR (US);
Chia-Hong Jan, Portland, OR (US);
Paul Packan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 12/700,637

(22) Filed: Feb. 4, 2010

(65) Prior Publication Data

US 2010/0133595 A1 Jun. 3, 2010

Related U.S. Application Data

(60) Division of application No. 12/231,172, filed on Aug. 28, 2008, now Pat. No. 7,682,916, which is a division
(Continued)

(51) Int. Cl.
*H01L 21/336* (2006.01)
*H01L 29/66* (2006.01)
(Continued)

(52) U.S. Cl.
CPC .... *H01L 29/66621* (2013.01); *H01L 29/0847* (2013.01); *H01L 29/1083* (2013.01);
(Continued)

(58) Field of Classification Search
CPC ................................................ H01L 29/6659
(Continued)

(56) References Cited

U.S. PATENT DOCUMENTS 4,714,685 A 12/1987 Schubert
4,870,029 A 9/1989 Easter et al.
(Continued)

FOREIGN PATENT DOCUMENTS

JP 5075045 3/1993
JP 5-206407 8/1993
(Continued)

OTHER PUBLICATIONS

Ishikawa, Y., "SiGe-on-Insulator Substrate Using SiGe Alloy Grown Si" 75 Applied Physics Letters No. 7963 (Apr. 1999).
(Continued)

*Primary Examiner* — Jack Chen
(74) *Attorney, Agent, or Firm* — Blakely, Sokoloff, Taylor & Zafman LLP

(57) ABSTRACT

Microelectronic structures embodying the present invention include a field effect transistor (FET) having highly conductive source/drain extensions. Formation of such highly conductive source/drain extensions includes forming a passivated recess which is back filled by epitaxial deposition of doped material to form the source/drain junctions. The recesses include a laterally extending region that underlies a portion of the gate structure. Such a lateral extension may underlie a sidewall spacer adjacent to the vertical sidewalls of the gate electrode, or may extend further into the channel portion of a FET such that the lateral recess underlies the gate electrode portion of the gate structure. In one embodiment the recess is back filled by an in-situ epitaxial deposition of a bilayer of oppositely doped material. In this way, a very abrupt junction is achieved that provides a relatively low resistance source/drain extension and further provides good off-state subthreshold leakage characteristics. Alternative embodiments can be implemented with a back filled recess of a single conductivity type.

16 Claims, 4 Drawing Sheets

Related U.S. Application Data of application No. 10/917,722, filed on Aug. 12, 2004, now Pat. No. 7,436,035, which is a division of application No. 09/831,539, filed as application No. PCT/US99/26224 on Nov. 5, 1999, now Pat. No. 6,887,762, which is a continuation-in-part of application No. 09/191,076, filed on Nov. 12, 1998, now abandoned.

(51) Int. Cl.

| | | |
|---|---|---|
| *H01L 29/08* | (2006.01) | |
| *H01L 29/10* | (2006.01) | |
| *H01L 29/16* | (2006.01) | |
| *H01L 29/161* | (2006.01) | |
| *H01L 29/165* | (2006.01) | |
| *H01L 29/417* | (2006.01) | |
| *H01L 29/49* | (2006.01) | |
| *H01L 29/78* | (2006.01) | |
| *H01L 21/20* | (2006.01) | |

(52) U.S. Cl.
CPC .......... *H01L 29/16* (2013.01); *H01L 29/161* (2013.01); *H01L 29/165* (2013.01); *H01L 29/41766* (2013.01); *H01L 29/41783* (2013.01); *H01L 29/4925* (2013.01); *H01L 29/66477* (2013.01); *H01L 29/66628* (2013.01); *H01L 29/66636* (2013.01); *H01L 29/7834* (2013.01); *H01L 29/7848* (2013.01); *H01L 21/2022* (2013.01); *H01L 29/665* (2013.01); *H01L 29/66492* (2013.01); *H01L 29/66545* (2013.01)

(58) Field of Classification Search
USPC .......................................... 438/300; 257/408
See application file for complete search history.

(56) References Cited

U.S. PATENT DOCUMENTS

| | | | |
|---|---|---|---|
| 4,963,502 A | 10/1990 | Teng et al. | |
| 5,012,306 A * | 4/1991 | Tasch, Jr. ............ | H01L 29/0847 257/335 |
| 5,241,193 A | 8/1993 | Pfiester et al. | |
| 5,268,324 A | 12/1993 | Aitken et al. | |
| 5,300,447 A | 4/1994 | Anderson | |
| 5,336,903 A | 8/1994 | Ozturk et al. | |
| 5,367,184 A | 11/1994 | Chantre | |
| 5,371,396 A | 12/1994 | Vinal et al. | |
| 5,409,848 A | 4/1995 | Han et al. | |
| 5,417,180 A | 5/1995 | Nakamura | |
| 5,442,205 A | 8/1995 | Brasen | |
| 5,504,018 A | 4/1996 | Sato | |
| 5,527,721 A | 6/1996 | Farb | |
| 5,620,912 A | 4/1997 | Hwang et al. | |
| 5,683,924 A | 11/1997 | Chan et al. | |
| 5,710,450 A | 1/1998 | Chau et al. | |
| 5,777,364 A | 7/1998 | Crabbe | |
| 5,814,543 A | 9/1998 | Nishimoto et al. | |
| 5,864,161 A * | 1/1999 | Mitani et al. .................. | 257/347 |
| 5,908,313 A | 6/1999 | Chau et al. | |
| 5,949,116 A | 9/1999 | Wen | |
| 5,956,590 A | 9/1999 | Hsieh et al. | |
| 5,994,747 A | 11/1999 | Wu | |
| 6,010,936 A | 1/2000 | Son | |
| 6,022,783 A | 2/2000 | Wu | |
| 6,025,235 A | 2/2000 | Krivokapic | |
| 6,048,756 A * | 4/2000 | Lee et al. .................... | 438/151 |
| 6,071,783 A * | 6/2000 | Liang et al. .................. | 438/301 |
| 6,081,010 A | 6/2000 | Sanchez | |
| 6,091,076 A | 7/2000 | Deleonibus | |
| 6,134,424 A | 10/2000 | Nishihori et al. | |
| 6,165,826 A | 12/2000 | Chau et al. | |
| 6,187,620 B1 | 2/2001 | Fulford et al. | |
| 6,222,251 B1 | 4/2001 | Holloway | |
| 6,274,894 B1 | 8/2001 | Wieczorek et al. | |
| 6,426,535 B1 | 7/2002 | Takeuchi et al. | |
| 6,492,688 B1 | 12/2002 | Ilg | |
| 6,563,152 B2 | 5/2003 | Roberds et al. | |
| 6,830,976 B2 | 12/2004 | Fitzgerald | |
| 6,887,762 B1 | 5/2005 | Murthy et al. | |
| 7,338,873 B2 | 3/2008 | Murthy et al. | |
| 7,436,035 B2 | 10/2008 | Murthy et al. | |
| 7,682,916 B2 | 3/2010 | Murthy et al. | |
| 2004/0219726 A1 | 11/2004 | Fitzgerald | |

FOREIGN PATENT DOCUMENTS

| | | |
|---|---|---|
| JP | 63076481 A1 | 4/1998 |
| WO | WO 00/30169 | 5/2000 |
| WO | PCT/US99/26224 | 10/2000 |
| WO | PCT/US99/26224 | 2/2005 |

OTHER PUBLICATIONS

Wolf, S., Silicon Processing for the VLSI Era: vol. 2, Process Integration 66-69 (Lattice Press 1990).

Schonenberg, K., "The Stability of $Si_{1-x}Ge_x$ Strained Layers on Small-Area Trench Isolation Silicon", J. Mater Res., vol. 12, No. 2, (Feb. 1997).

Wolf, S., Silicon Processing for the VLSI Era: vol. 1, Process Technology 397-399 (Lattice Press 1990).

M.T. Currie, et al., "Controlling Threading Dislocation Densities in Ge on Si Using Graded SiGe Layers and Chemical-Mechanical Polishing," American Institute of Physics, vol. 72 No. 5, (1998), pp. 1718-1720.

S. John, et al., "Progression of the Surface Roughness of $N^+$ Silicon Epitaxial Films As Analyzed by AFM," Mat. Res. Soc. Symp. Proc. vol. 399, Materials Research Society (1996), pp. 123-128.

M. Kubota, et al., "New SOI CMOS Process With Selective Oxidation," IEDM, (1986), pp. 814-816.

W.P. Maszara, et al., "Silicon-On-Insulator by Wafer Bonding and Etch-Back," Aerospace Technology Center, Columbia, MD. p. 15.

M. Morris Mano, "Digital Design, " Prentice-Hall, Inc., New Jersey, (1984), pp. 56-60, 425-427.

S.D.S Malhi, et al., "Novel SOI CMOS Design Using Ultra Thin Near Intrinsic Substrate," IEEE. (1982), pp. 107-111.

Y. Ishikawa, et al., "SiGe-On-Insulator Substrate Using SiGe Alloy Grown Si (001)," American Institute of Physics, vol. 75 No. 7, (1999), pp. 983-985 (i-iii).

A.J. Pidduck, et al., "Measurement of Silicon Wafer Roughness by Atomic Force Microscopy: An Interlaboratory Comparison," Papers presented at Microsc. Semicond. Mater, Conf., Oxford, Apr. 1997, pp. 601-606.

J.B. Lasky, et al., "Silicon-On-Insulator (SOI) by Bonding and Etch-Back," IEEE, IBM General Technology Division, (1985), pp. 684-687.

K. Schonenberg, et al., "The Stability of $Si_{1-x}GE_x$ Strained Layers on Small-Area Trench Isolated Silicon," J. Mater Res., vol. 12, No. 2 (1997), pp. 364-370.

T. Tezuka, et al., "A Novel Fabrication Technique of Ultrathin and Relaxed SiGe Buffer Layers with High Ge Fraction for Sub-100nm Strained Silicon-on-Insulator MOSFETs," Jpn. J. Appl. Phys. vol. 40 (2001), pp. 2866-2874.

C. Teichert, et al., "Comparison of Surface Roughness of Polished Silicon Wafers Measured by Light Scattering Topography, Soft X-Ray Scattering, and Atomic-Force Microscopy," Appl. Phys. Lett. 66 (18), (1995), pp. 2346-2348.

J. Warabisako, et al., "Characterization of Laser-SOI Double Si Active Layers by Fabricating Elementary Device Structures," IEEE, Japan, (1982) pp. 433-4-38.

W.P. Maszara et al., "Silicon-on—Insulator by Wafer Bonding and Etch-Back", Aerospace Technology Center, Allied-Signal Aerospace Company, Columbia MD 21045.

(56) References Cited

OTHER PUBLICATIONS

C. Jungemann et al., "Full-Band Monte Carlo Simulation of a 0.12um-Si-PMOSFET with and without a Strained SiGe-Channel", 1998 IEEE, IEDM98-897, pp. 33.4.1-33.4.4.

M. Jurczak et al., "Study on Enhanced Performance in NMOSFETs on Strained Silicon", France Telecom, CNET Grenoble, P.B. 98, 38243 Cedex, France (GRESSI Program), pp. 304-307.

Andrew Zangwill et al., Evolution of Epitaxial Structure and Morphology, Materials Research Society Symposium Proceedings vol. 399, pp. 121-128.

Y. Mitani et al., "Buried Source and Drain (BSD) Structure for Ultra-Shallow Junction Using Selective Deposition of Highly Doped Amorphous Silicon", 1996 Symposium on VLSI Technology Digest of Technical Papers, IEEE 1996, pp. 176-177.

Takashi Uchino et al., A Raised Source/Drain Technology Using In-situ P-doped SiGe and B-doped Si for -0.1 um CMOS ULSIs, 1997 IEEE, IEDM 97-479, pp. 18.6.1-18.6.4.

Nakara, Y., et al., Ultra-Shallow In-Situ-Doped Raised Source/Drain Structure for Sub-tenth Micron CMOS, 1996 Symposium on VLSI Technology Digest of Technical Papers, 1996 IEEE, pp. 174-175.

Notice of Preliminary Rejection dated Jan. 28, 2003, Korean Patent Application No. 10-2001-7006013 corresponding to U.S. Appl. No. 12/700,637.

* cited by examiner

FIELD EFFECT TRANSISTOR STRUCTURE WITH ABRUPT SOURCE/DRAIN JUNCTIONS

RELATED APPLICATIONS

This is a divisional of pending U.S. patent application Ser. No. 12/231,172, filed Aug. 28, 2008 which is a divisional of U.S. patent application Ser. No. 10/917,722, filed Aug. 12, 2004 (now U.S. Pat. No. 7,436,035), which is a divisional of U.S. patent application Ser. No. 09/831,539, filed Apr. 15, 2002 (now U.S. Pat. No. 6,887,762), which is a 35 USC §371 application from PCT/US99/26224, filed Nov. 5, 1999, which is a continuation-in-part of U.S. patent application Ser. No. 09/191,076, filed Nov. 12, 1998, now abandoned. The contents of each of these applications are incorporated herein by reference.

BACKGROUND OF THE INVENTION

Field of the Invention

The invention relates to metal-oxide-semiconductor field effect transistors (MOSFETs) and more particularly to transistor structures having abrupt junctions, and methods of making same.

Background

The trend of integrating more functions on a single substrate while operating at ever higher frequencies has existed in the semiconductor industry for many years. Advances in both semiconductor process technology and digital system architecture have aided in producing these more highly integrated and faster operating integrated circuits.

The desired result of many recent advances in semiconductor process technology has been to reduce the dimensions of the transistors used to form the individual circuits found on integrated circuits. There are several well-recognized benefits of reducing the size of transistors. In the case of MOSFETs, reducing the channel length provides the capability to deliver a given amount of drive current with a smaller channel width. By reducing the width and length of a FET, the parasitic gate capacitance, which is a function of the area defined by the width and length can be reduced, thereby improving circuit performance. Similarly, reducing the size of transistors is beneficial in that less area is consumed for a given circuit, and this allows more circuits in a given area, or a smaller, less costly chip, or both.

It has also been well known that MOSFETs can not simply be scaled down linearly. That is, as the width and length attributes of a MOSFET are reduced, other parts of the transistor, such as the gate dielectric and the junctions must also be scaled so as to achieve the desired electrical characteristics. Undesirable electrical characteristics in MOSFETs due to improper scaling include coupling of the electric field into the channel region and increased subthreshold conduction. These effects are sometimes referred to in this field as short channel effects.

A number of methods have been developed to form ever more shallow source/drain junctions for MOSFETs in order to achieve proper scaling. Unfortunately, these very shallow junctions create source/drain extensions that have increased resistivity as compared with deeper source/drain junctions. In longer channel length MOSFETs with deeper source/drain junctions, the source/drain extension resistivity was negligible compared to the on-resistance of the MOSFET itself. However, as MOSFET channel lengths decrease into the deep sub-micron region, the increased source/drain extension resistivity becomes a significant performance limitation.

What is needed is a field effect transistor structure having very short channel length and low source/drain extension resistivity, yet operable to produce high drive currents without suffering from the short channel effects that produce significant levels of off-state current. What is further needed is a method of manufacturing such a structure.

SUMMARY OF THE INVENTION

Briefly, a MOSFET structure includes highly conductive source/drain extensions of a first conductivity type, and super abrupt junctions with a semiconductor body of a second conductivity type.

In a further aspect of the invention, a process for forming a MOSFET includes removing portions of the substrate to form recesses that are adjacent and partially subjacent a FET gate structure, and back filling the recesses with an epitaxial process.

DETAILED DESCRIPTION

Overview

Figure 2:
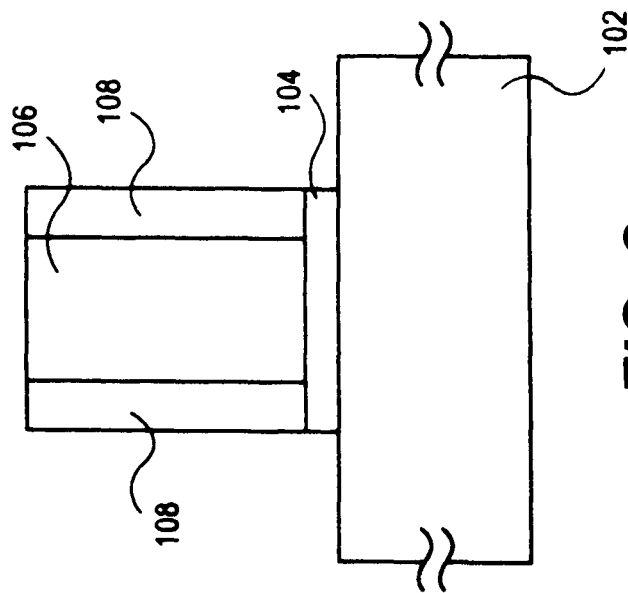
FIG. 2 is a schematic cross-section showing the structure of FIG. 1, after an anisotropic etch of the spacer layer forms thin sidewall spacers, and the gate dielectric not covered by the gate electrode or sidewall spacers is removed.

Conventional source/drain junction formation is accomplished by an ion implantation operation that is self-aligned to the gate electrode, or alternatively, aligned to sidewall spacers that are adjacent to the gate electrode. Reasonable transistor performance has been achieved in this way for many generations of semiconductor process technology. However, as transistor scaling has brought FET channel lengths down into the deep sub-micron region, the changes to source/drain junction depth and doping concentration required to achieve desirable electrical performance of FETs have increased the parasitic resistance associated with the FET source/drain terminals to the point where this parasitic resistance is significant compared to the on-resistance of the FET. In this field, the parasitic resistance is sometimes referred to as external resistance. More particularly, simultaneously obtaining the very shallow junction depth, high source-drain extension doping concentration, and abrupt change in doping profile between the body and source/drain junctions, all required for desirable electrical performance in deep submicron FETs has become extremely difficult to achieve with conventional processes.

An illustrative embodiment of the present invention provides a FET with highly conductive source/drain extensions and abrupt junctions. Methods of forming the FET structure of the present invention include isotropically etching the substrate adjacent to, and partially underneath, the gate dielectric layer of a FET, and selectively depositing bilayers of in-situ doped material of a first conductivity type, and a second conductivity type.

FETs embodying the present invention include back-filled source and drain terminals. In this way, the doping concentration of the source/drain terminals can be controlled by controlling the gas mixture, temperature, and pressure, in a reaction chamber. With the precise control of doping concentration of the material being deposited, the embodiments of the present invention include microelectronic devices having very abrupt junctions. Furthermore, particular embodiments of the present invention may eliminate high-energy ion implantation of the source/drain junctions. Formation of the source/drain junctions in this way also provides increased margin for the process thermal budget, since a high temperature operation is not required to activate the dopants, or to thermally in-diffuse the dopants into the tip portion of the source/drain terminals.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni) and tungsten (W) and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

Epitaxial layer refers to a layer of single crystal semiconductor material.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal. Source/drain terminals are typically formed in a semiconductor substrate and have a conductivity type (i.e., p-type or n-type) that is the opposite of the conductivity type of the substrate. Sometimes, source/drain terminals are referred to as junctions. Generally, the source and drain terminals are fabricated such that they are geometrically symmetrical. Source/drain terminals may include extensions, sometimes referred to as tips, which are shallower than other portions of the source/drain terminals. The tips typically extend toward the channel region of a FET, from the main portion of the source/drain terminal. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Figure 1:
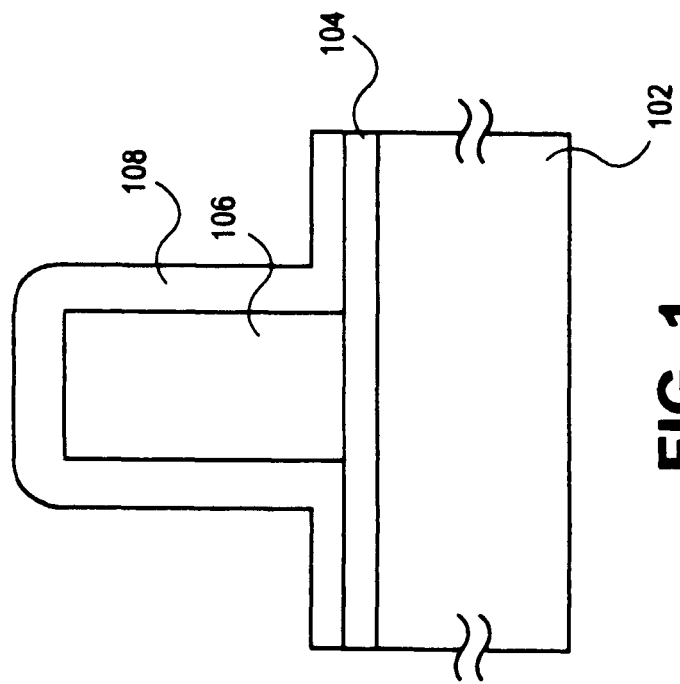
FIG. 1 is a schematic cross-section of a wafer in process showing a substrate with a gate dielectric formed thereon, and a patterned gate electrode over the gate dielectric and a spacer layer formed over the surface of the wafer.

Referring to FIGS. 1-6, an illustrative embodiment of the present invention is described. As shown in FIG. 1, a wafer is processed in known ways to form a thin film layer over a patterned gate electrode and over a gate dielectric layer that has been disposed on the top surface of the wafer. More particularly, as shown in FIG. 1, a substrate 102 has a gate dielectric layer 104 disposed over the surface thereof, and a patterned gate electrode 106 is formed over gate dielectric layer 104. In the illustrative embodiment, substrate 102 is a silicon wafer, gate dielectric layer 104 is a silicon dioxide layer, and gate electrode 106 is formed from polysilicon. Although gate dielectric layer 104 is typically a thin layer of oxidized silicon, the thickness and chemical make-up of the gate insulator layer may be varied within the scope of the invention.

Those skilled in the art and having the benefit of this disclosure will recognize that although field oxide regions are not shown in the Figures, the operations and structures shown and described herein, are compatible with various field oxide isolation architectures. Examples of field oxide isolation architectures include shallow trench isolation regions in a surface of a substrate, and the older local oxidation of silicon, which formed non-planarized oxide isolation regions.

A thin film layer 108 is deposited over the surface of gate electrode 106 and the portions of gate dielectric layer 104 not already covered by gate electrode 106. Thin film layer 108 may also be referred to as a spacer layer because spacers adjacent to the side walls of gate electrode 106 are formed from layer 108 in subsequent processing operations. It is preferable for spacer layer 108 to have etch characteristics that are different from the etch characteristics of substrate 102 and gate electrode 106. The material for spacer layer 108 could be any dielectric material including, but not limited to, nitride, oxynitride, and oxide. In the illustrative embodiment, subsequent to the polysilicon etch that forms gate electrode 106, a thin layer of silicon nitride is deposited over the surface of the substrate to form spacer layer 108. In one embodiment, the silicon nitride layer is approximately 20 nm thick, and is formed in a vertical diffusion furnace. However, the thickness of the nitride layer is not a limitation of the invention and it may be made any practical thickness, for example, in a range of from 2 nm to 50 nm thick. This nitride layer will be used to provide the needed selectivity during a subsequent epitaxial backfill operation. Similarly, the spacer layer may be formed of another material such as, for example, silicon dioxide. Silicon dioxide has a dielectric constant that is lower than the dielectric constant of silicon nitride, and this is advantageous in terms of lowering parasitic capacitance between the gate electrode and other nearby circuit nodes.

Referring to FIG. 2, spacer layer 108 is etched anisotropically using, for example, conventional dry etch chemistries for silicon nitride. Subsequent to this etch operation, no significant amount of residual silicon nitride remains in the source/drain regions. In the illustrative embodiment, this anisotropic etch operation leaves a nitride layer approximately 150 nm thick (when measured along a vertical axis) along the sidewalls of polysilicon gate electrode 106. Typically, the vertical height (i.e., thickness) of this layer is approximately equal to the thickness of gate electrode 106. These post-etch nitride structures are referred to as spacers. As can be seen in FIGS. 1-2, that portion of silicon nitride spacer layer 108 that is superjacent to the top surface of gate electrode 106 is removed by the spacer layer etch operation.

Figure 3:
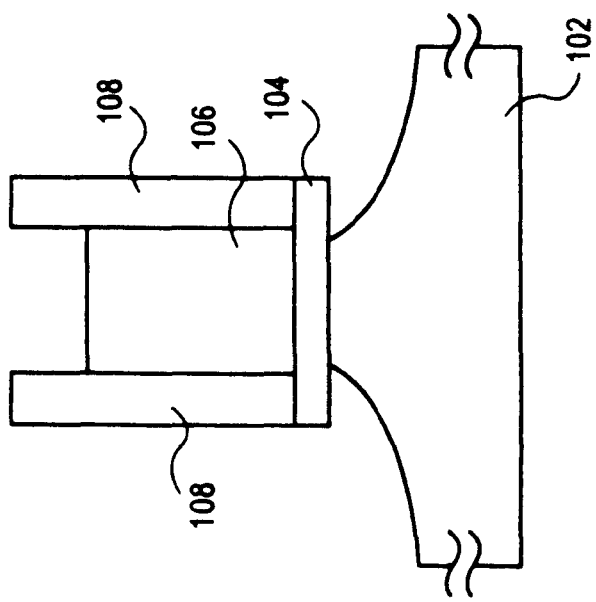
FIG. 3 is a schematic cross-section showing the structure of FIG. 2, after an isotropic etch removes portions of the substrate, to form recesses therein, and further showing a portion of the gate electrode etched away.

Referring to FIG. 3, a plurality of recesses in substrate 102 are produced by using an isotropic dry etch process in a parallel plate RF plasma etching system. A mixture of sulfur hexafluoride ($SF_6$) and helium (He), at process conditions that favor isotropy are employed. Such conditions include high pressure and low RF power density. In one embodiment of the present invention, a process pressure of approximately 900 mT, a gap of 1.1 cm, an RF power of 100 W, a He flow of 150 sccm, and a $SF_6$ flow of 100 sccm is used. RF power may be varied in a range, for example, of 50 W to 200 W, and the process pressure may be varied but should be greater than approximately 500 mT. This etch process is highly selective and is characterized by a silicon etch rate that is much greater than the etch rate of the silicon dioxide that forms gate dielectric layer 104. Similarly, the etch rate of silicon substrate 102 is much greater than the etch rate of the silicon nitride that forms sidewall spacers 108. The electrical characteristics of gate dielectric layer 104 are not adversely affected by the etch process that forms the recesses in substrate 102.

As can be seen in FIG. 3, the recesses include a portion that underlies gate dielectric layer 104. In the illustrative embodiment, substrate 102 is etched isotropically such that the lateral etch creates a recessed area that reaches underneath not only the spacer but also partially underneath a region defined by overlying gate electrode 106.

Note that, since silicon nitride spacer layer 108 was removed from the top surface of polysilicon gate electrode 106, the etch that forms the recess also etches the top surface of polysilicon gate electrode 106, thereby reducing its height as shown in FIG. 3.

Those skilled in the art and having the benefit of this disclosure will recognize that the operations and structures disclosed above are applicable to the formation of both n-channel FETs (NFETs) and p-channel FETs (PFETs). PFETs and NFETs are structurally similar, however the relative placement of p-type and n-type dopants is different. That is, a PFET includes p-type source/drain terminals in an n-type body, and an NFET includes n-type source/drain terminals in a p-type body.

Figure 4:
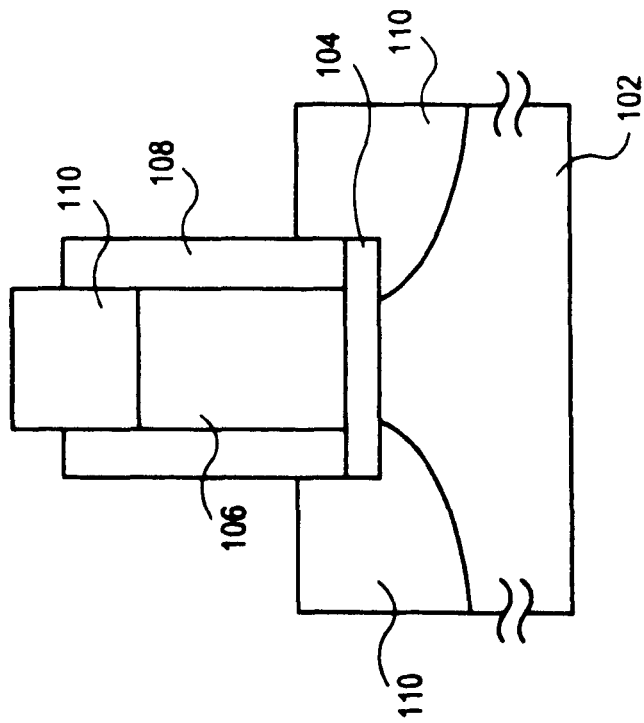
FIG. 4 is a schematic cross-section showing the structure of FIG. 3, after the recesses have been back-filled and the gate electrode thickness built up.

The illustrative embodiment is described in terms of the formation of a PFET. It should be recognized that the present invention applies to the structure and manufacture of NFETs as well. Referring now to FIG. 4, an epitaxial film of boron doped Si 110 is formed using $SiH_2Cl_2$ based chemistry such that the deposition is highly selective to nitride spacer 108, i.e., the film of boron doped Si 110 does not form on, nor adhere to, silicon nitride spacer 108. However, the recesses are substantially filled by this deposition operation. The recess may be completely filled by this operation. No ex-situ cleaning operations are performed. This is because an external wet clean would tend to damage thin gate dielectric layer 104. In an alternative embodiment, boron doped SiGe may be used in place of boron doped Si to form the film that fills the recess. Typically, epitaxial film 110 is deposited such that its top surface is above the plane of the original surface of substrate 102. This can be seen in FIG. 4 by comparing the relative positions of gate dielectric layer 104, which was formed on the original surface of substrate 102, with the top surface of Si layer 110. As is further shown in FIG. 4, an epitaxial film of boron doped Si 110 is also formed on top of gate electrode 106. In this way the thickness of polysilicon gate electrode 106 is increased from its post-etch dimensions.

Still referring to FIG. 4, boron doped Si film 110 is formed by a selective deposition. A selective deposition of silicon, or a silicon alloy such as silicon germanium, forms silicon, or the silicon alloy, on the exposed silicon surfaces. For example, a selective deposition of boron doped silicon creates Si film 110 on the exposed surfaces of silicon substrate 102, and polysilicon gate electrode 106. A silicon film can be selectively deposited by heating the wafer to a temperature of approximately 600° C. to 900° C., providing a deposition gas comprising dichlorosilane ($SiH_2Cl_2$), and hydrogen ($H_2$). More particularly, an n-type silicon can be selectively deposited at a temperature of approximately 750° C., with approximately 10 slm $H_2$, approximately 30 sccm HCl, approximately 100 sccm $SiH_2Cl_2$, and approximately 180 sccm $PH_3$, at approximately atmospheric pressure. Such process conditions can deposit a layer approximately 50 nm thick in approximately 6 minutes. A p-type silicon can be selectively deposited at a temperature of approximately 800° C., with approximately 20 slm $H_2$, approximately 70 sccm HCl, approximately 120 sccm $SiH_2Cl_2$, and approximately 75 sccm $B_2H_6$. Such process conditions can deposit a layer approximately 50 nm thick in approximately 155 seconds.

A silicon germanium alloy can be selectively deposited by heating the wafer to a temperature between approximately 700° C. and 750° C., providing a deposition gas mix comprising dichlorosilane at a rate of between approximately 10 to 100 sccm, 1% hydrogen diluted germane ($GeH_4$) at a rate of between approximately 10 to 200 sccm, and hydrogen at a rate of approximately 20 slm into a CVD chamber maintained at a pressure between approximately 50 to 760 torr. A dopant gas such as diborane, phosphine, or arsine, can be included in the process gas mix if a doped silicon or silicon alloy film is desired.

A highly doped (>5×10$^{20}$ atoms/cm$^3$) n-type silicon germanium epitaxial film can be selectively deposited onto silicon surfaces by thermal chemical vapor deposition utilizing a deposition gas mix comprising approximately 10 to 200 sccm GeH$_4$, approximately 10 to 100 sccm dichlorosilane, 10 to 40 slm H$_2$, 1 to 200 sccm PH$_3$, and 15 sccm HCl, while maintaining the substrate at a temperature between 700° C. and 750° C. and maintaining a deposition pressure of approximately 165 torr during film deposition. Such a process will form a substantially uniformly doped n-type silicon germanium epitaxial film. Similarly, a p-type silicon germanium alloy can be formed by decomposition of approximately 20 sccm of dichlorosilane, approximately 80 sccm germane, approximately 20 slm H$_2$ and a p-type dopant source, such as approximately 1-200 sccm of B$_2$H$_6$ at a temperature of approximately 740° C. In order to increase the selectivity of the deposition process, approximately 10 sccm of HCl can be added to the gas mix. Such process conditions can deposit a layer approximately 50 nm thick in approximately 75 seconds.

Those skilled in the art and having the benefit of this disclosure, will recognize that, the deposition operation is such that selectivity to oxide in field oxide regions, or shallow trench isolation regions is also achieved.

Figure 5:
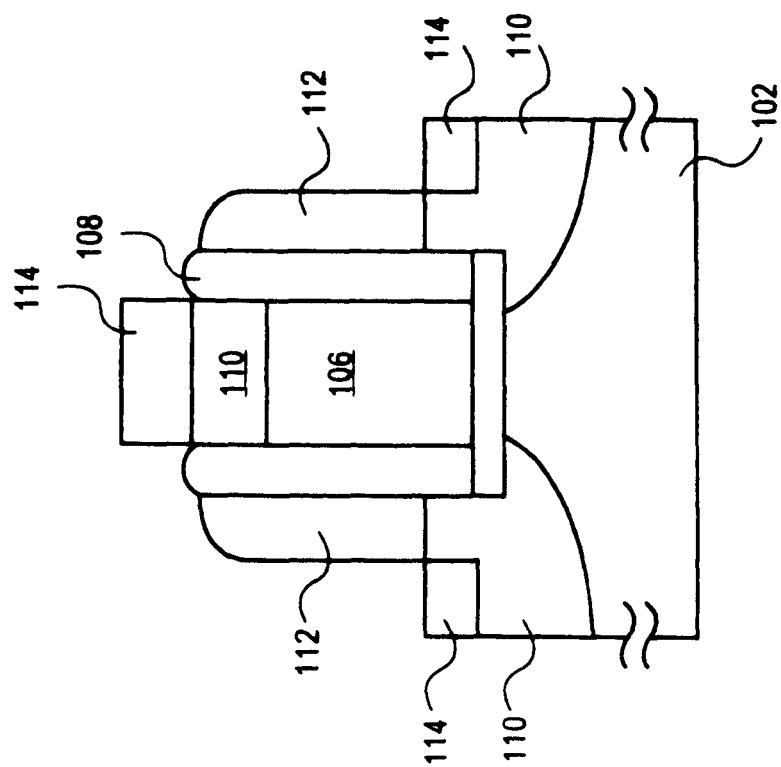
FIG. 5 is a schematic cross-section showing the structure of FIG. 4, after a salicidation operation.

FIG. 5 shows the FET structure of FIG. 4 after further processing operations are performed. Conventional processing may be used to form additional sidewall spacers 112 that are disposed along opposing sidewall spacers 108. Furthermore, conventional processing may be used to form salicided regions 114 over the top surfaces of doped Si regions 110, that is, the source/drain extension regions and polysilicon gate electrode 106. It should be noted that the structure of the present invention is advantageous in the formation of salicided source/drain extensions. For example, when a metal such as nickel, which diffuses in silicon relatively easily, is used to form a nickel salicide layer, lateral diffusion of nickel atoms is stopped by nitride side wall spacers 108 and the nickel atoms therefore do not penetrate into the channel region where they would otherwise adversely affect the electrical characteristics of the MOSFET. It can be seen in FIG. 4, that the thickness of Si 110 and the depth of salicide layer 114 can be varied with the scope of the invention and still benefit from the structure's metal atom diffusion barrier characteristics.

Figure 6:
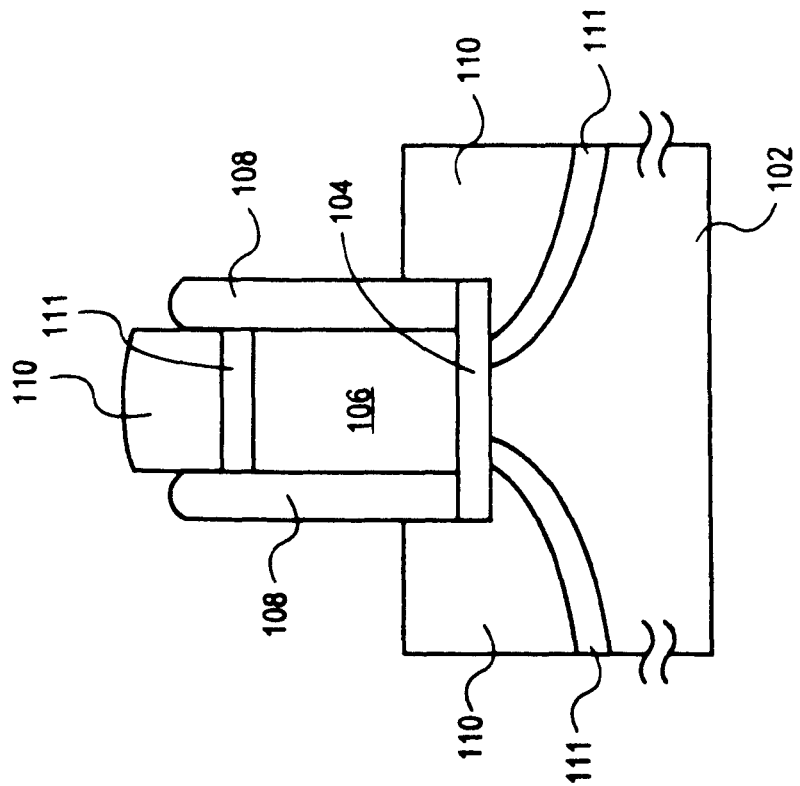
FIG. 6 is a schematic cross-section showing the structure of FIG. 3, after an alternative process flow in which the back-filling of the recesses includes forming a layer of a first conductivity type followed by formation of a layer of a second conductivity type.

Referring to FIG. 6, in a further alternative embodiment of the present invention, a layer of phosphorous doped Si 111 is epitaxially formed, prior to an in-situ epitaxial formation of boron doped Si 110. Those skilled in the art and having the benefit of this disclosure will appreciate that other n-type dopants may be used in place of phosphorous. Arsenic is an example of an alternative n-type dopant.

Since the doping concentration of the single crystal epitaxial layer is a function of the gas mixture, temperature, and pressure, in an epitaxial reaction chamber, it is possible to first form a highly doped Si layer (or Si$_{1-x}$Ge$_x$, x=0 to 0.3) 111 of a first conductivity type (e.g., n-type by doping with phosphorous). Then without exposing the wafer to the atmosphere, changing the gas mixture, temperature, and pressure, such that a highly doped Si layer 110 of a second conductivity type (e.g., p-type by doping with boron) is formed immediately superjacent Si layer 111. In this way, the recesses in substrate 102 are filled with a bi-layer of single crystal silicon (or Si$_{1-x}$Ge$_x$, x=0 to 0.3) having a very abrupt junction.

Desirable electrical characteristics may be obtained in this way by having a relatively lightly doped substrate 102 of a first conductivity type, highly doped source/drain terminals 110 of a second conductivity type, and a highly doped region 111 of the first conductivity type disposed between source/drain terminals 110 and lightly doped substrate 102. Due to the nature of the selective deposition process (described above), highly doped regions 110, 111, are not only highly doped in the source/drain extension regions, but also in the tip-to-gate overlap region. The term tip, is generally used to refer to that portion of the source/drain junction that is subjacent to the gate and adjacent to the channel portion of a FET.

Figure 7:
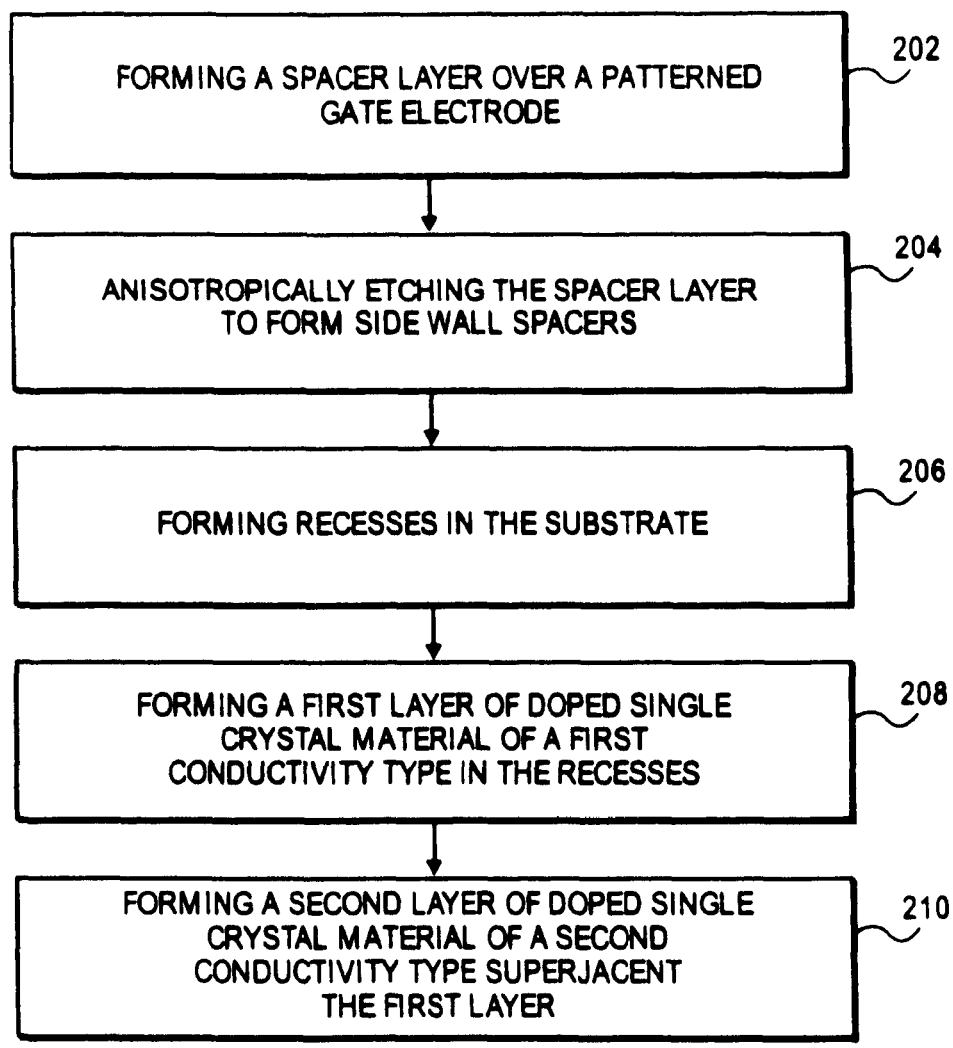
FIG. 7 is a flow diagram illustrating the various operations in a manufacturing process in accordance with the present invention.

In conjunction with FIG. 7, the operations of fabricating a FET on a wafer in accordance with an illustrative embodiment of the present invention are described. An operation (block 202) is performed wherein a spacer layer is formed over a patterned gate electrode. In an illustrative embodiment of the present invention, the gate electrode is comprised of polysilicon that has previously been deposited over a gate dielectric layer. The gate dielectric is typically oxidized silicon. In the illustrative embodiment having an oxide gate dielectric and a polysilicon gate electrode, the spacer layer is typically silicon nitride. Those skilled in the art and having the benefit of this disclosure will recognize that the invention is not limited to the combination of an oxide dielectric and polysilicon gate electrode. By way of example and not limitation, the gate dielectric layer may consist of an oxide layer and a nitride layer in combination. Similarly, by way of example and not limitation, the gate electrode may be formed from a metal rather than polysilicon.

After the spacer layer has been formed, it is subjected to an anisotropic etch (block 204) in which sidewall spacers are formed. During the anisotropic etch, portions of the spacer layer that are superjacent the top surface the gate electrode and the top surface of the wafer are removed. The remaining portion of the spacer layer disposed along the opposing vertical sidewalls of the gate electrode.

Recesses are formed in the wafer (block 206) at locations where the source/drain terminals of the FET will be located. The recesses are formed by the isotropic etch of the wafer. As is understood in this field, an isotropic etch operation will remove material from the wafer surface both vertically and laterally. The etch chemistry and conditions are preferably chosen such that the etch is highly selective and preferentially etches the wafer rather than the side wall spacers or the gate dielectric layer. In the illustrative embodiment, wherein the wafer is silicon, the gate dielectric is an oxide of silicon, the gate electrode is polysilicon and the side wall spacers are silicon nitride, a plasma etch with sulfur hexafluoride (SF$_6$) and helium (He) is used.

After the recesses are formed, the wafer is typically placed in an epitaxial reactor and a first layer of doped crystalline material is formed (block 208). The crystalline material may be, for example, p-type silicon, p-type silicon germanium, n-type silicon, or n-type silicon germanium. Typically, the conductivity type of the first layer matches the conductivity type of that portion of the wafer where the FET is being fabricated. Those skilled in the art will recognize that various portions of the wafer may be doped and/or counterdoped so as to form wells within which FETs may be formed. For example, n-channel FETs (NFETs) are formed within a p-type region of the wafer, whereas p-channel FETs (PFETs) are formed within an n-type region of the wafer.

After the first layer is formed, a second layer of doped crystalline material is formed (block 210). The second layer is typically formed without exposing the first layer to the atmosphere. That is, the second layer and first layer are formed in a continuous in-situ operation, in the same reaction chamber simply by changing the gas mixture, temperature, and pressure in the epitaxial reactor. The crystalline material may be, for example, p-type silicon, p-type silicon germanium, n-type silicon, or n-type silicon germanium. Typically, the conductivity type of the second layer is chosen to be opposite that of the first layer. In this way, extremely abrupt junctions can be obtained.

For example, a gate structure of a PFET is formed in a region of a n-type portion of a silicon wafer, and after the source/drain recesses are formed, a first layer of n-doped (e.g., phosphorous) silicon germanium is formed in the recesses, and then a second layer of p-doped (e.g., boron) silicon germanium is formed over the first layer. Both the first and second layers have doping concentrations that are substantially higher than the doping concentration of the n-type portion of the silicon wafer, which forms the body terminal of the PFET. More particularly, the first and second layer are substantially free of counterdopants, whereas the n-type region of the wafer typically contains both n-type and p-type dopants. A gate structure may be a gate electrode or a gate electrode and adjacent side wall spacers.

A salicidation operation is typically performed to further reduce the sheet resistivity of the source/drain terminals and gate electrode.

Conclusion

Embodiments of the present invention provide a field effect transistor structure having very short channel length and low source/drain extension resistivity, yet operable to produce high drive currents without suffering from the short channel effects that produce significant levels of off-state current. Further embodiments of the present invention provide methods of manufacturing such a structure.

An advantage of particular embodiments of the present invention is that source/drain terminals can be formed without annealing. By eliminating the high temperature step conventionally required to activate the dopants, thermal diffusion is avoided and the very abrupt junctions are maintained.

An advantage of particular embodiments of the present invention is that the raised junctions formed by back filling, in conjunction with the side wall spacers disposed along opposing vertical walls of the gate electrode, substantially prevent lateral diffusion of metal atoms in the transistor channel region during the salicidation operation.

An advantage of particular embodiments of the present invention is placement of active dopants directly in the tip portion of the source/drain terminals.

An advantage of particular embodiments of the present invention is that a very precise doping profile is achieved.

An advantage of particular embodiments of the present invention is that very shallow, highly doped, source/drain terminals can be formed without ion implantation of the tip portion. In some cases, even a deep source/drain implant, typically used to form portions of source/drain terminals that lie further from the channel region, may be eliminated.

It will be understood by those skilled in the art having the benefit of this disclosure that many design choices are possible within the scope of the present invention. For example, structural parameters, including but not limited to, gate insulator thickness, gate insulator materials, gate electrode thickness, sidewall spacer material, inter-layer dielectric material, isolation trench depth, and S/D and well doping concentrations may all be varied from that shown or described in connection with the illustrative embodiments. Similarly, the operation of forming recesses and back filling with doped crystalline material may be repeated to tailor the shape and doping profile of the source/drain terminals.

It will be understood that various other changes in the details, materials, and arrangements of the parts and steps which have been described and illustrated may be made by those skilled in the art having the benefit of this disclosure without departing from the principles and scope of the invention as expressed in the subjoined Claims.

What is claimed is:

1. A transistor, comprising:
   a gate stack disposed on a substrate, the gate stack comprising a gate electrode disposed above a gate dielectric layer;
   a pair of recesses disposed in the substrate, and partially underneath the gate electrode; and
   a p-type doped single crystalline silicon germanium material layer disposed in the pair of recesses and partially underneath the gate electrode.

2. The transistor of claim 1, wherein the gate electrode is a metal gate electrode.

3. The transistor of claim 1, wherein the gate stack further comprises a pair of sidewall spacers adjacent the gate electrode and the gate dielectric layer.

4. The transistor of claim 1, wherein the substrate has a top surface and the p-type doped single crystalline silicon germanium material layer has a top surface, and wherein the top surface of the p-type doped single crystalline silicon germanium material layer is above the top surface of the substrate.

5. The transistor of claim 4, wherein the gate stack further comprises a pair of sidewall spacers adjacent the gate electrode and the gate dielectric layer, and wherein the p-type doped single crystalline silicon germanium material layer is adjacent to the pair of sidewall spacers.

6. The transistor of claim 1, further comprising:
   crystalline material of n type conductivity type disposed on the type doped single crystalline silicon germanium material layer disposed in the pair of recesses.

7. The transistor of claim 6, wherein the crystalline material of n type conductivity type is selected from the group consisting of n-type silicon, and n-type silicon germanium.

8. A transistor, comprising:
   a gate stack disposed on a substrate, the gate stack comprising a gate electrode disposed above a gate dielectric layer;
   a pair of recesses disposed in the substrate, and partially underneath the gate electrode;
   a doped silicon germanium single crystalline material layer disposed in the pair of recesses and partially underneath the gate electrode, the doped silicon germanium single crystalline material layer of at least a first conductivity type; and
   a crystalline material of a second conductivity type disposed on the doped silicon germanium single crystalline material layer disposed in the pair of recesses, the second conductivity type opposite the first conductivity type.

9. The transistor of claim 8, wherein the doped silicon germanium single crystalline material layer of the first conductivity type is selected from the group consisting of p-type silicon germanium and n-type silicon germanium.

10. The transistor of claim 8, wherein the gate electrode is a metal gate electrode.

11. The transistor of claim 8, wherein the gate stack further comprises a pair of sidewall spacers adjacent the gate electrode and the gate dielectric layer.

12. The transistor of claim 8, wherein the substrate has a top surface and the doped silicon germanium single crystalline material layer has a top surface, and wherein the top surface of the doped silicon germanium single crystalline material is above the top surface of the substrate.

13. The transistor of claim 12, wherein the gate stack further comprises a pair of sidewall spacers adjacent the gate electrode and the gate dielectric layer, and wherein the doped silicon germanium single crystalline material layer is adjacent to the pair of sidewall spacers.

14. The transistor of claim 8, wherein the crystalline material of the second conductivity type is selected from the group consisting of p-type silicon, p-type silicon germanium, n-type silicon, and n-type silicon germanium.

15. A transistor, comprising:
- a gate stack disposed on a substrate, the gate stack comprising a gate electrode disposed above a gate dielectric layer;
- a pair of recesses disposed in the substrate, and partially underneath the gate electrode; and
- a doped crystalline material disposed in the pair of recesses and partially underneath the gate electrode, the doped crystalline material of at least a first conductivity type; and
- a crystalline material of a second conductivity type disposed on the doped crystalline material disposed in the pair of recesses, the second conductivity type opposite the first conductivity type.

16. The transistor of claim 15, wherein the crystalline material of the second conductivity type is selected from the group consisting of p-type silicon, p-type silicon germanium, n-type silicon, and n-type silicon germanium.

* * * * *

UNITED STATES PATENT AND TRADEMARK OFFICE
CERTIFICATE OF CORRECTION

| | | |
|---|---|---|
| PATENT NO. | : 9,640,634 B2 | Page 1 of 1 |
| APPLICATION NO. | : 12/700637 | |
| DATED | : May 2, 2017 | |
| INVENTOR(S) | : Murthy et al. | |

It is certified that error appears in the above-identified patent and that said Letters Patent is hereby corrected as shown below:

In the Claims

In Column 10, at Line 37, delete "type" and insert --p-type--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*